(12) United States Patent
Kutkut et al.

(10) Patent No.: US 7,173,429 B2
(45) Date of Patent: Feb. 6, 2007

(54) ACTIVITY-BASED BATTERY MONITOR WITH A UNIVERSAL CURRENT MEASURING APPARATUS

(75) Inventors: Nasser H. Kutkut, Sun Prairie, WI (US); David Brobst, Chico, CA (US); Hristo Slavov, Madison, WI (US)

(73) Assignee: Power Designers, LLC, Madison, WI (US)

( * ) Notice: Subject to any disclaimer, the term of this patent is extended or adjusted under 35 U.S.C. 154(b) by 370 days.

(21) Appl. No.: 10/735,244

(22) Filed: Dec. 12, 2003

(65) Prior Publication Data

US 2005/0127918 A1 Jun. 16, 2005

(51) Int. Cl.
*G01N 27/416* (2006.01)

(52) U.S. Cl. ...................... 324/431; 324/433

(58) Field of Classification Search ............... 324/426, 324/431, 433, 427, 428
See application file for complete search history.

(56) References Cited

U.S. PATENT DOCUMENTS

| | | | |
|---|---|---|---|
| 3,979,657 A | 9/1976 | Yorski | |
| 4,316,185 A | 2/1982 | Watrous et al. | |
| 4,387,334 A | 6/1983 | Loper | |
| 4,929,931 A | 5/1990 | McCuen | |
| 4,990,885 A | 2/1991 | Irick et al. | |
| 5,095,274 A | 3/1992 | Brokaw | |
| 5,130,659 A | 7/1992 | Sloan | |
| 5,179,340 A | 1/1993 | Rogers | |
| 5,394,089 A | 2/1995 | Clegg | |
| 5,646,534 A | 7/1997 | Kopera | |
| 5,717,310 A | 2/1998 | Sakai et al. | |
| 5,808,469 A | 9/1998 | Kopera | |
| 5,886,503 A | 3/1999 | McAndrews et al. | |
| 5,895,440 A | 4/1999 | Proctor et al. | |
| 6,037,749 A | 3/2000 | Parsonage | |
| 6,118,384 A | 9/2000 | Sheldon et al. | |
| 6,150,795 A | 11/2000 | Kutkut et al. | |
| 6,222,370 B1 | 4/2001 | Schousek et al. | |
| 6,268,710 B1 | 7/2001 | Koga | |
| 6,304,062 B1 | 10/2001 | Batson | |
| 6,522,123 B2* | 2/2003 | Ribes ........................ 324/126 |
| 6,544,078 B2* | 4/2003 | Palmisano et al. .......... 439/762 |
| 6,549,014 B1* | 4/2003 | Kutkut et al. ............... 324/426 |
| 6,850,037 B2* | 2/2005 | Bertness ..................... 320/132 |

FOREIGN PATENT DOCUMENTS

| | | |
|---|---|---|
| WO | WO 97/15839 | 5/1997 |
| WO | WO 99/34224 | 7/1999 |

* cited by examiner

*Primary Examiner*—Edward H. Tso
(74) *Attorney, Agent, or Firm*—Foley & Lardner LLP

(57) ABSTRACT

A battery monitoring apparatus that obtains a current measurement for a current in a conductive element. The battery monitoring apparatus includes conductive lines configured to couple to a conductive element having an electrical current, a filter coupled to the conductive lines and configured to filter noise from a signal derived from a voltage difference between the conductive lines, an analog-to-digital converter that converts the signal filtered by the filter and outputs a digital signal, and a controller that receives the digital signal from the analog-to-digital converter.

25 Claims, 4 Drawing Sheets

ACTIVITY-BASED BATTERY MONITOR WITH A UNIVERSAL CURRENT MEASURING APPARATUS

FIELD OF THE INVENTION

The present invention pertains generally to the field of battery condition monitoring and management and, more particularly, to a universal current measuring apparatus for use with a battery monitor.

BACKGROUND OF THE INVENTION

Current shunts (DC shunts) are widely used in many applications to measure the device or system current for metering and control applications. Generally, a conventional DC shunt is a four terminal device that is constructed using special metal elements having a known resistance, $R_{DC}$. The resistive elements are welded between two posts or terminals (power terminals) that are used to interconnect the shunt in line with the main system or device current. Two separate terminals are used to sense the current flow through the resistive elements. The current measurement is made by measuring the voltage across the sense terminals and dividing that by the shunt resistance, namely $$I_{DC} = \frac{V_{DC}}{R_{DC}}.$$

In order to reduce the unwanted heating ($I^2R$) loss, most DC shunts are fabricated using very low resistive elements. For example, standard 50 mV shunts are offered with current ratings in excess of 1000 A resulting in a shunt resistance of 50 micro-ohms. Due to the low resistive nature of DC shunts, they are normally calibrated to ensure accurate current measurement across the sense leads.

One of the selection criteria for the shunt resistive elements is the need to have a very low temperature coefficient to minimize resistance variations with temperature. The $I^2R$ loss causes the shunt temperature to rise, causing its resistance to change. A very low temperature coefficient material has minimal resistance variation with its temperature, thus requiring no adjustment for measured currents at any temperature.

In many applications, installing a DC shunt is not a straightforward task. For example, in flooded Lead-Acid batteries, the intercell connectors are welded on the battery posts and cannot be easily removed. If current sensing needs to be added for monitoring purposes, an existing intercell connector needs to be removed first before welding the replacement DC shunt. This is a labor-intensive process, especially if it is to be performed in the field. In addition, if the battery has more than two posts (more than one intercell connector), replacing only one intercell connector with a shunt will cause the currents between the shunt and the remaining intercell connector to be unequal due to the large mismatch in resistance. Finally, since batteries have variable post designs and distances between posts, a large number of custom shunts need to be developed to fit the various battery designs.

Thus, there is a need to overcome limitations of DC shunts. Further, there is a need for a universal current measuring apparatus that can measure the current of any conductive element link. Even further, there is a need for accurate current measurements for use with an activity-based battery monitor.

SUMMARY OF THE INVENTION

In order to overcome the limitations of DC shunts described above in accordance with the invention, accurate current measurements can be made using an existing conductive element or link in the system or an intercell connector in a battery application. Since a conductive link or intercell connector is made of a highly conductive material (e.g., lead or copper), the current can be obtained by measuring the voltage drop across the conductive element and dividing it by the resistance of that element. Using a conductive element or intercell connector as the current sense device is advantageous as it allows for easy addition of current measurement capabilities with minimal labor and leads to wider adoption of intelligent systems.

The limitations of DC shunts can be resolved by employing a universal current measuring apparatus that can sense the current passing through any conductive link of any size, shape, or material. The universal current measuring apparatus can include analog circuitry to scale and filter the measured signals, microprocessor controls for programming and user interface along with temperature sensing and programming capabilities.

One exemplary embodiment of the invention relates to a battery monitoring apparatus that obtains a current measurement for a current in a conductive element. The battery monitoring apparatus includes conductive lines configured to couple to a conductive element through which electrical current flows, a filter coupled to the conductive lines and configured to filter noise from a signal derived from a voltage difference between the conductive lines, an analog-to-digital converter that converts the signal filtered by the filter and outputs a digital signal, and a controller that receives the digital signal from the analog-to-digital converter.

Another exemplary embodiment relates to a method for obtaining a current in an activity-based battery monitoring apparatus. The method includes filtering a signal from wires coupled to a conductive element where the signal results from a voltage drop across the conductive element, converting the signal from an analog form to a digital form, and correcting the digital form of the signal based on temperature at the conductive element and storing the digital form of the signal according to the formula:

$$TCF = \frac{R(T)}{R(T_o)} = 1 + TCx(T - T_o),$$

where To is the reference temperature at which calibration is performed, R(To) is the resistance at a reference temperature, R(T) is the resistance at a desired temperature, and TC is the temperature coefficient of resistance of the conductive element.

Another exemplary embodiment relates to a battery monitoring apparatus including a voltage sense input port, a current sense input port, an output communications port through which data may be communicated, a non-volatile memory, and a programmable microcontroller. The voltage sense input port can be connected to leads extending to a battery such that a signal representing the voltage across the battery is provided to the voltage sense input port. The current sense input port can be connected to leads extending to a universal current measuring apparatus such that a signal representing the current through the battery is provided to the universal current measuring apparatus. The universal current measuring apparatus includes a filter to remove noise from received signals, an analog-to-digital converter to convert an analog current signal to a digital signal, and a controller programmed to monitor the digital signal representative of the current to detect a change in battery state from one of the states of battery charging, discharging, and open circuit to another state, and to define a battery event between changes of state. The programmable microcontroller is connected to the voltage sense to receive signals therefrom and connected to the output communications port to at least transmit signals thereto. The microcontroller is connected to provide data to and from the non-volatile memory, the microcontroller, to monitor the battery voltage during each event, and to selectively transfer data from the non-volatile memory through the output communications port after a period of time in which events have occurred.

Further objects, features and advantages of the invention will be apparent from the following detailed description when taken in conjunction with the accompanying drawings.

DETAILED DESCRIPTION OF EXEMPLARY EMBODIMENTS

Figure 1:
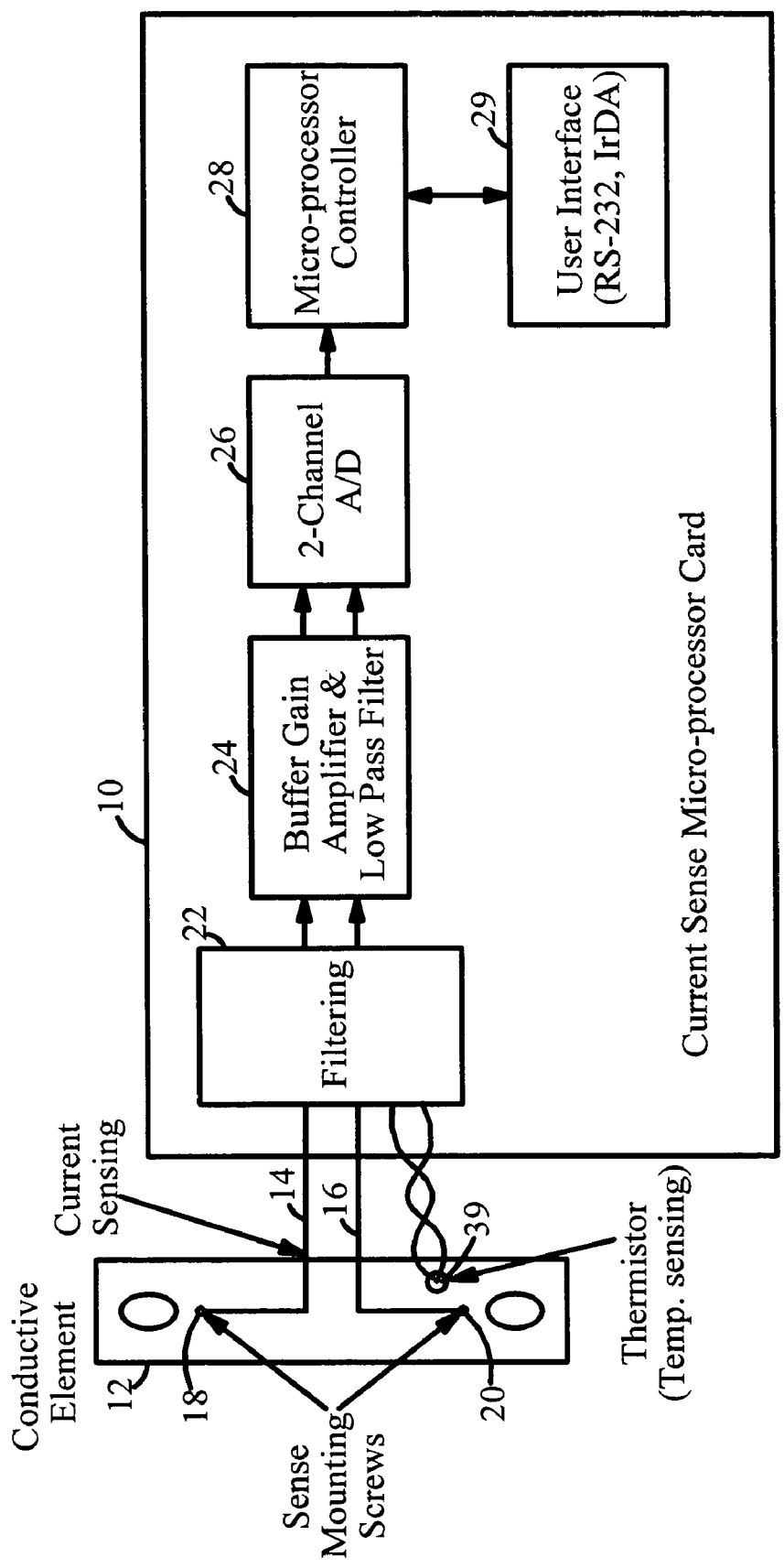
FIG. 1 is a block diagram of a universal current measuring apparatus that measures the current of any conductive element link in accordance with an exemplary embodiment.

FIG. 1 illustrates a universal current measuring apparatus 10 that measures the current of any conductive element link. The apparatus 10 is connected to a conductive element 12 by two wires 14 and 16. The two wires 14 and 16 are attached across the conductive element link using self-tapping screws 18 and 20. The screws 18 and 20 can be, for example, a distance of 2 to 3 inches apart.

The separation of the two wires 14 and 16 along the conductive element 12 results in a voltage drop which is proportional to the resistance in between the two sense leads. The distance between the sense leads can be adjusted to obtain an approximate target voltage drop (typically, a few millivolts) at a given current. For example, in a battery application, if an intercell connector is used to measure current, connecting the sense lead 2 inches apart across an intercell connector may yield a 50 mV voltage drop at 1000 A nominal current. Since the spacing may not be exact from one system to another in a multi-installation application, and since the conductive link may vary from one system to another, the measurement needs to be calibrated by the user. An example calibration technique is described below with reference to FIG. 2.

The two wires 14 and 16 are coupled to a filter 22 in the apparatus 10. The filter 22 filters out noise from the signal resulting from the voltage drop between wires 14 and 16. This signal is passed to a buffer gain amplifier and low pass filter 24. The buffer gain amplifier and low pass filter 24 filters the signal representing the current readings. The analog current readings are processed by a two-channel A/D 26 which supplies digital data to a microprocessor controller 28. An on-board user interface 29, such as a serial RS-232 or an infrared IrDA, allows users to interface with the controller 28 so as to program the calibration values.

Figure 2:
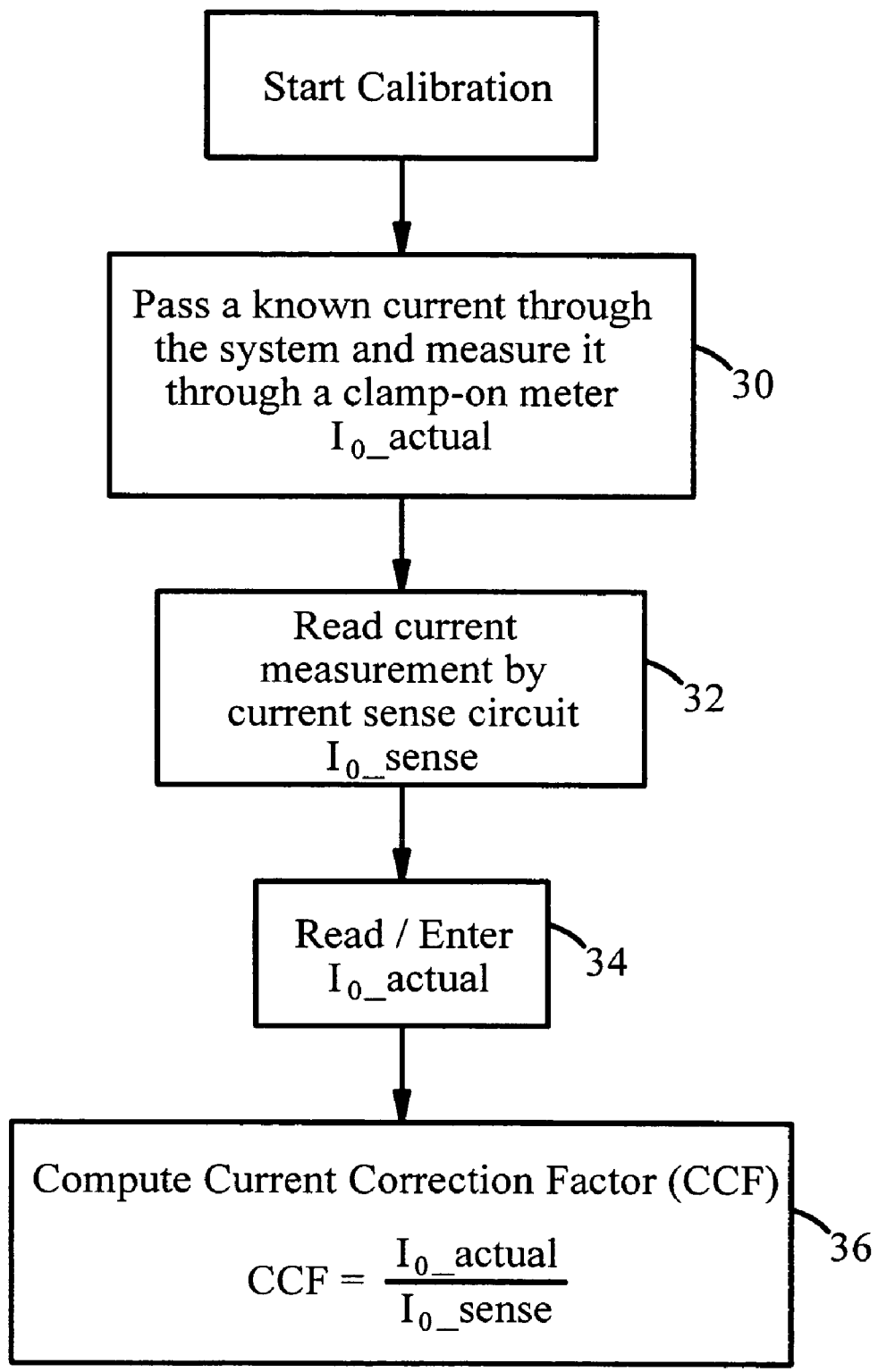
FIG. 2 is a flow diagram depicting operations performed in a single point calibration technique.

FIG. 2 illustrates operations performed in a single point calibration technique. Fewer, additional, or different operations may be performed in alternative embodiments. To calibrate a conductive link or element, a software calibration tool can be used to program the universal current measuring apparatus and compute the required scaling factors. This is achieved via the on-board serial or infrared communication ports.

In an initial operation 30, the calibration procedure starts by passing a known current through the system or the battery and, in an operation 32, proceeds by measuring the current using an external clamp on-meter as well as the universal current measuring apparatus that is already connected across the conductive link or intercell connector. If there is a difference between the two currents, the actual value is programmed into the measuring apparatus in an operation 34, and the internal firmware of the unit computes a current correction factor (CCF) to scale the measured current to match the actual current in an operation 36.

For additional accuracy, two or multi-point calibrations can be used to obtain a piece-wise linear curve for the voltage drop across the conductive element over its operating range. The calibration procedure is similar to the single point calibration where a number of measurements are obtained via the clamp-on meter and are compared with the measurement by the current sense circuit. A linear curve fit is then computed to calculate the measured output current.

Referring again to FIG. 1, in order to correct for the resistance variation with temperature, a thermistor 39 is used to measure the temperature at the conductive element end, in between the two sense leads' connections. The temperature readout is fed back to the on board processor which then computes a temperature correction factor (TCF) for the resistance of the conductive element given by:

$$TCF = \frac{R(T)}{R(T_o)} = 1 + TCx(T - T_o)$$

where To is the reference temperature at which calibration is performed (e.g. 77° F.), $R(T_o)$ is the resistance at the reference temperature, R(T) is the resistance at the desired temperature, and TC is the temperature coefficient of resistance of the conductive element. The current measured is then divided by TCF, which corrects for resistance variation, namely, $$I_{actual} = \frac{I_{o\_sense}}{TCF}.$$

The temperature coefficient of resistance (TC) of the conductive element can be programmed upon installation or can be pre-programmed into the firmware where the temperature correction factors for all standard conductive metals are stored and selected during installation, depending on the material used for current sensing.

Figure 3:
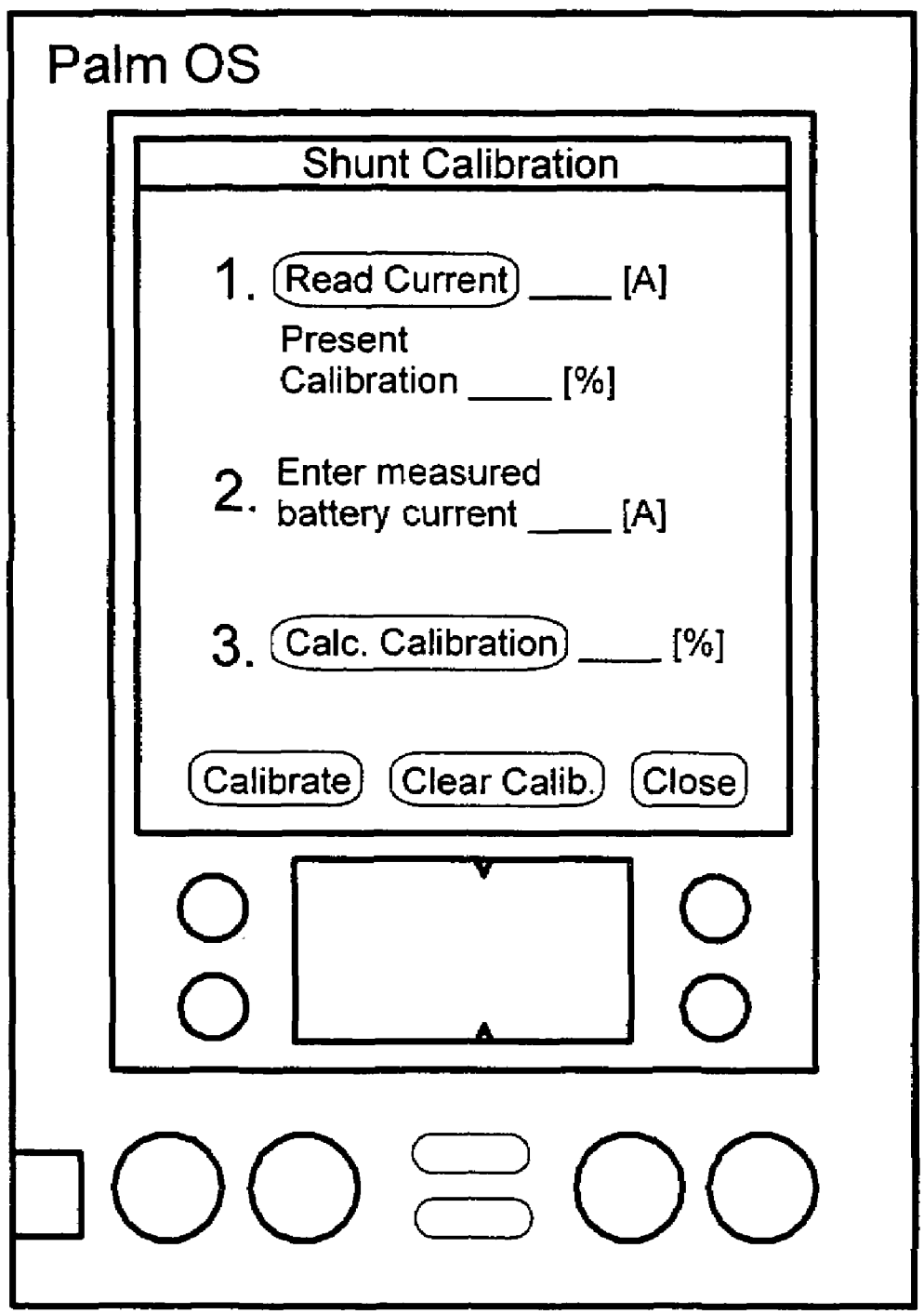
FIG. 3 is a representation of a Palm software interface screen for interfacing with the apparatus of FIG. 1.

The above calibration procedure can be automated via a dedicated software that communicates to the processor via an on-board serial link (RS-232), or IrDA link, or any other link. FIG. 3 illustrates an example of a Palm software interface screen that may be used to interface with an IrDA interface.

As shown in FIG. 3, the calibration procedure starts by first reading the current measured by the universal current measuring apparatus (Read Current Command). The user uses a clamp-on meter to measure the actual system current and enters it into the shunt calibration software (operation 30 in FIG. 2). The software program calculates the current correction factor (CCF) (operation 36 in FIG. 2), which can be programmed into the unit by tapping the Calibrate command button on the user interface.

The current measurement apparatus can interface with various measuring systems digitally through its serial link and can pass current measurements back to a central controller. For example, the current measurement apparatus can be used as a smart current sensor as part of a battery monitoring system where it passes the current measurement back to the main monitoring controller for further analysis and logging. An example battery monitoring system is described in U.S. Pat. No. 6,549,014 entitled "Battery Monitoring Method and Apparatus," which is incorporated herein by reference in its entirety.

Figure 4:
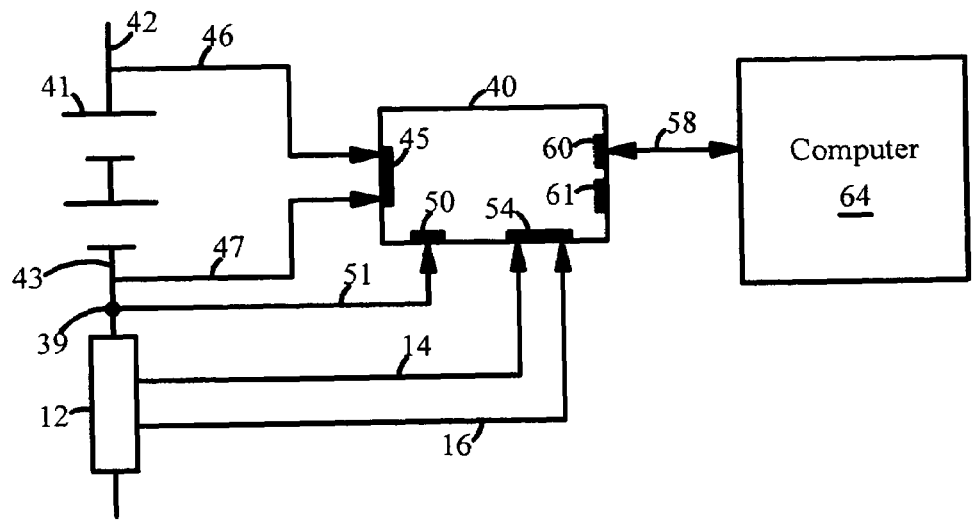
FIG. 4 is a block diagram of a battery monitoring apparatus in accordance with an exemplary embodiment.

FIG. 4 illustrates a battery monitoring apparatus 40 connected to monitor the conditions in a battery 41 connected at its positive and negative terminals to conductors 42 and 43. The battery monitor 40 has a voltage sense input port 45 which is connected by conducting lines 46 and 47 to the conductors 42 and 43 on either side of the battery to allow the voltage across the battery to be monitored. A temperature sense input port 50 is connected by a conducting line 51 to receive a signal from the thermistor 39 which is connected to the battery 41.

A current sense input port 54 is connected by conducting lines 14 and 16 to the conductive element 12 (see also FIG. 1) which is connected to one of the battery conductors (e.g., the conductor 43 as shown) to detect the level and direction of current flowing through the battery. The monitoring apparatus 40 has an output port 58 which may include a digital communications port 60 (e.g., an RS-232 port) and an infrared (IrDA) port 61. The data output port 60 may be connected via a communications link 63 to a remote system such as a computer 64, e.g., a PC, for periodic communications to and from the battery monitoring apparatus 40. The IrDA port 61 allows communication to an IrDA device such as a handheld personal digital assistant, and other wired and wireless communication links may also be utilized as desired.

Figure 5:
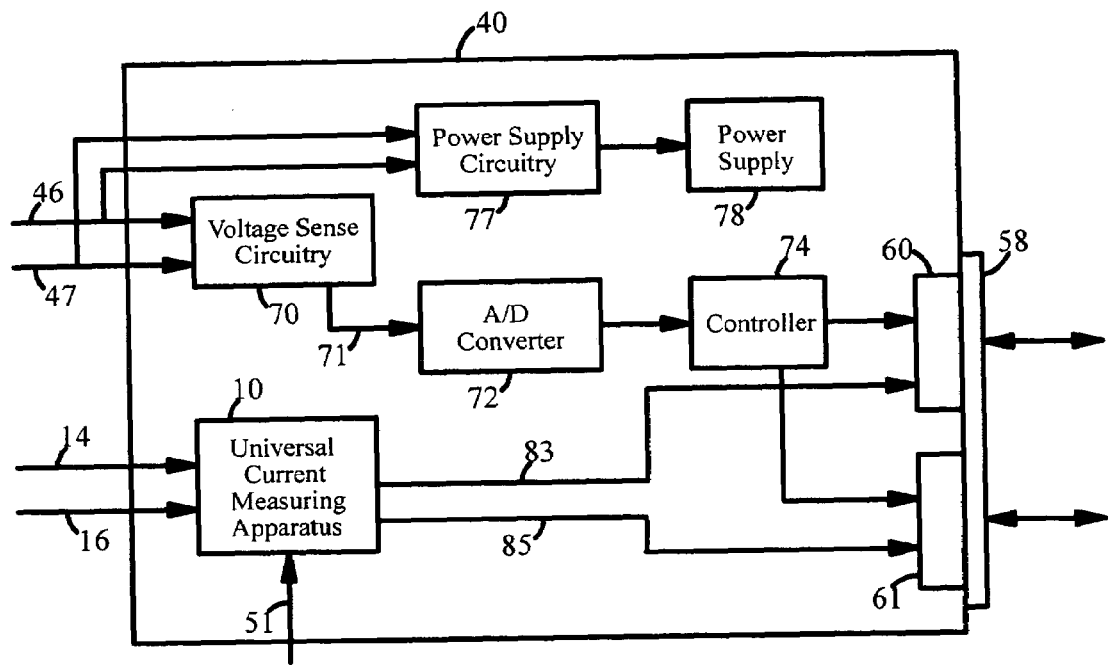
FIG. 5 is a block diagram of the battery monitoring apparatus of FIG. 4.

FIG. 5 illustrates a block diagram of the battery monitoring apparatus 40, which may be enclosed in a separate case mounted adjacent to the battery. As illustrated in FIG. 5, the voltage across the battery provided on the conducting lines 46 and 47 to the input port 45 is supplied to a voltage sense and conditioning circuit 70 which provides a conditioned output signal on a line 71 to an analog to digital (A/D) converter 72. The output of the A/D converter 72 is supplied on digital data lines 73 to a micro-controller 74, e.g., a digital signal processor (DSP) chip.

The voltage on the lines 46 and 47 is also transmitted by conducting leads 76 to a power supply circuit 77 to supply the internal power needs of the battery monitoring apparatus 10. The power supply circuit 77 preferably provides linear or switched regulated power through an isolation transformer to an isolated power supply 78 that provides the power required by the RS-232 port 60. The RS-232 port 60 is isolated from the power supplied to the rest of the monitoring apparatus 40 to provide protection to users who may connect a computer directly to the apparatus 40 through the RS-232 port 60.

The signal on the current sense lines 14 and 16 and the temperature sense signal on the line 51 is provided through to the current sense apparatus 10. The user interface 29 (FIG. 1) of the current sense apparatus 10 communicates over lines 83 and 85 to the RS-232 port 60 and the infrared port 61. Although the current sense apparatus 10 may be physically packaged with the other circuitry of FIG. 5, it is preferably located close to the conductive element 12 to reduce noise and interference.

The current measuring apparatus 10 described above with reference to the Figures includes at least the following advantages. The apparatus has the ability to measure the current across any conductive element or link. The apparatus has the ability to automatically calibrate the measured current against a known current measurement using, for example, a clamp-on meter. Further, the apparatus has the ability to compensate for temperature variations by employing a thermistor. In addition, the apparatus has the ability to provide a simple and intelligent user interface for easy interfacing and programming.

It is understood that the invention is not confined to the exemplary embodiments set forth herein as illustrative, but embraces all forms thereof as come within the scope of the following claims.

What is claimed is:

1. A battery monitoring apparatus comprising:
    conductive lines configured to couple to a conductive element having an electrical current;
    a filter coupled to the conductive lines and configured to filter noise from a signal derived from a voltage difference between the conductive lines, wherein the signal represents a current in the conductive element resulting from the voltage difference;
    an analog-to-digital converter that converts the signal filtered by the filter and outputs a digital signal;
    a meter configured to measure an actual current; and
    a controller that receives the digital signal and the measured actual current and computes a correction factor using the received digital signal and the received actual current.

2. The battery monitoring apparatus of claim 1, wherein the conductive element comprises a direct current (DC) shunt.

3. The battery monitoring apparatus of claim 1, further comprising an operational amplifier circuit configured to filter the signal filtered by the filter.

4. The battery monitoring apparatus of claim 3, wherein the filter, the analog-to-digital converter, the controller, and the operational amplifier circuit are located on a current sensing microprocessor card.

5. The battery monitoring apparatus of claim 1, further comprising a thermistor coupled to the conductive element and configured to measure temperature at the conductive element.

6. The battery monitoring apparatus of claim 5, wherein the thermistor provides temperature information used by the controller to compute a temperature correction factor according to the formula:

$$TCF = 1 + TC_x(T - T_o)$$

where T is the measured temperature. $T_o$ is the reference temperature at which calibration is performed, and $TC_x$ is the temperature coefficient of resistance of the conductive element.

7. The battery monitoring apparatus of claim 1, wherein the controller computes the correction factor as the received actual current over the received digital signal.

8. The battery monitoring apparatus of claim 1, wherein the controller is further programmed to perform a calibration procedure by which a multi-point correction line is computed using the received digital signal and the received actual current.

9. The battery monitoring apparatus of claim 1, wherein the meter is a clamp-on meter.

10. A method for obtaining a current in an activity-based battery monitoring apparatus, the method comprising:
   filtering a signal from wires coupled to a conductive element, wherein the signal represents a sensed current resulting from a voltage drop across the conductive element;
   converting the signal from an analog form to a digital form; and
   performing a calibration procedure by which a correction factor is computed using an actual current measurement and the sensed current.

11. The method of claim 10, further comprising performing a calibration procedure by which a multi-point correction line is computed from the actual current measurement and the sensed current.

12. The method of claim 10, further comprising presenting a user interface to read the sensed current and receive the actual current measurement as an input.

13. The method of claim 10, further comprising correcting the digital form of the signal based on a temperature at the conductive element according to the formula:

$$TCF=1+TC_x(T-T_o)$$

where T is the measured temperature, $T_o$ is the reference temperature at which calibration is performed, and $TC_x$ is the temperature coefficient of resistance of the conductive element.

14. A battery monitoring apparatus comprising:
   (a) a voltage sense input port to which leads extending to a battery may be connected such that a voltage signal representing the voltage across the battery is provided to the voltage sense input port; and
   (b) a current sense input port to which leads extending to a universal current measuring apparatus may be connected such that a current signal representing the current through the battery is provided to the universal current measuring apparatus, wherein the universal current measuring apparatus comprises a first filter to remove noise from a received current signal, an analog-to-digital converter to convert the filtered current signal to a digital signal, and a controller programmed to receive an actual current measurement and the digital signal and to compute a correction factor using the received actual current measurement and the received digital signal.

15. The battery monitoring apparatus of claim 14, further including a temperature sense input port coupled to the universal current measuring apparatus to receive a temperature signal during a battery event.

16. The battery monitoring apparatus of claim 14, wherein the universal current measuring apparatus is connected in series with the battery to detect a level and direction of current flowing through the battery.

17. The battery monitoring apparatus of claim 14, wherein the universal current measuring apparatus components are mounted on a printed circuit board.

18. The battery monitoring apparatus of claim 14, wherein the universal current measuring apparatus is coupled to an amplifier connected to receive the filtered current signal and a second filter to low-pass filter an output signal from the amplifier, and further wherein the analog to digital converter is connected to receive the filtered output signal from the second filter and to convert the received output signal into the digital signal.

19. The battery monitoring apparatus of claim 18, wherein the amplifier includes a high gain amplifier and a low gain amplifier, each amplifier connected to receive the filtered current signal, and wherein the analog to digital converter includes a first channel connected to receive an output signal from the high gain amplifier and a second channel connected to receive an output signal from the low gain amplifier, the controller further programmed to selectively receive the digital signal from the first analog to digital converter channel when the current signal is below a threshold value and from the second analog to digital converter channel when the current signal is above a threshold value.

20. The battery monitoring apparatus of claim 19, wherein the high gain amplifier saturates at a selected current level and the controller is programmed to select data from the second analog to digital converter channel when the digital signal from the first analog to digital converter channel is at the saturation level of the high gain amplifier.

21. The battery monitoring apparatus of claim 14, wherein the controller is further programmed to store one or more stationary data fields in a non-volatile memory selected from the group consisting of installation time, high voltage setpoint, low voltage setpoint, high current setpoint, high temperature setpoint, battery nominal capacity in ampere hours, battery nominal voltage, a cycle counter, total hours of open circuit overall events, total hours of discharge overall events, total hours of charge overall events, total amp-hours of discharge overall events, total amp-hours of charge overall events, and a count of the number of events recorded.

22. The battery monitoring apparatus of claim 21, wherein the controller is further programmed to store all of the stationary data fields from the group of stationary data fields.

23. The battery monitoring apparatus of claim 14, wherein the controller is programmed to perform a calibration procedure by which a multi-point correction line is computed using the received digital signal and the received actual current measurement.

24. The battery monitoring apparatus of claim 14, further comprising a thermistor configured to measure a temperature.

25. The battery monitoring apparatus of claim 24, wherein the controller is further programmed to compute a temperature correction factor according to the formula:

$$TCF=1+TC_x(T-T_o)$$

where T is the measured temperature, $T_o$ is the reference temperature at which calibration is performed, and $TC_x$ is the temperature coefficient of resistance of the conductive element.

* * * * *